(12) United States Patent
Hongo (10) Patent No.: US 6,428,661 B1
(45) Date of Patent: Aug. 6, 2002

(54) PLATING APPARATUS

(75) Inventor: Toshiaki Hongo, Shikishima-cho (JP)

(73) Assignee: Tokyo Electron Ltd., Tokyo (JP)

( * ) Notice: Subject to any disclaimer, the term of this patent is extended or adjusted under 35 U.S.C. 154(b) by 0 days.

(21) Appl. No.: 09/642,158

(22) Filed: Aug. 21, 2000

Related U.S. Application Data (63) Continuation of application No. PCT/JP99/06955, filed on Dec. 10, 1999.

(30) Foreign Application Priority Data

Dec. 21, 1998 (JP) .......................................... 10-363104

(51) Int. Cl.⁷ ................................................. C25B 9/00
(52) U.S. Cl. ....................................... 204/242; 273/279
(58) Field of Search ............................... 204/222, 273, 204/279, 242

(56) References Cited

U.S. PATENT DOCUMENTS

| | | | | |
|---|---|---|---|---|
| 3,933,601 A | * | 1/1976 | Ishibashi et al. ............ | 204/273 |
| 5,409,594 A | * | 4/1995 | Al-Jiboory et al. ......... | 205/148 |
| 5,437,733 A | * | 8/1995 | Okumura ...................... | 134/34 |
| 5,648,128 A | * | 7/1997 | Yeh et al. .................... | 427/601 |
| 5,653,860 A | * | 8/1997 | Nicholls et al. ............... | 205/80 |
| 6,037,020 A | * | 3/2000 | Garlough et al. ........... | 427/600 |

FOREIGN PATENT DOCUMENTS

| JP | 50-32047 | 3/1975 |
|---|---|---|
| JP | 7-221109 | 8/1995 |
| JP | 10-36996 | 2/1998 |

\* cited by examiner

*Primary Examiner*—Donald R. Valentine
(74) *Attorney, Agent, or Firm*—Finnegan, Henderson, Farabow, Garrett & Dunner LLP (57) ABSTRACT

This plating apparatus 4 includes a plating bath 15 filled up with a plating solution, a first O ring 17 arranged on a top part of the plating bath 15, for electrical connection with an underlying electrode 18 formed on a wafer 2, a second O ring 20 arranged on the top part of the plating bath 15 so as to prevent the plating solution in the plating bath 15 from contact with the first O ring 17, an anode plate 24 disposed in the plating bath 15 and an ultrasonic oscillating element 26 arranged in the plating bath 15. The plating apparatus 4 is capable of forming a plating film having an uniform thickness on the semiconductor wafer.

10 Claims, 8 Drawing Sheets

PLATING APPARATUS

This application is a Continuation of International Application No. PCT/JP99/06955, filed Dec. 10, 1999, the content of which is incorporated herein by reference.

TECHNICAL FIELD OF THE INVENTION

The present invention relates to a plating apparatus, a plating system and a plating method using the plating apparatus or the plating system. More particularly the invention relates to a plating apparatus, which allows a metal to be piled up on a substrate, such as a wafer, a plating system having the above function and a plating method using the above plating apparatus or the above plating system.

BACKGROUND OF THE INVENTION

As for the packaging of semiconductor chips on a substrate to construct an electronic instrument, it has been risen to package a great number of tips in a fixed area as possible, namely, the increased requirement of high-density packaging. With this requirement of high density packaging, the wiring on the substrate also has a tendency of high densification and therefore, the refined wiring adopting various methods has been progressed.

As the method of building the refined wiring, there is employed a plating method of first forming fine underlying electrodes on the substrate by a film deposition method, such as a chemical vapor deposition (CVD) method, and secondly depositing a metal on the underlying electrodes. In this plating method, it is firstly executed to dip the electrodes in a solution containing metallic ions. Thereupon, an electricity is supplied into the solution in order to cause a deoxidization on the negative pole (underlying electrode) and an oxidization on the positive pole, so that the metal can be piled up on the underlying electrode owing to the deoxidization on the negative pole.

Figure 9:
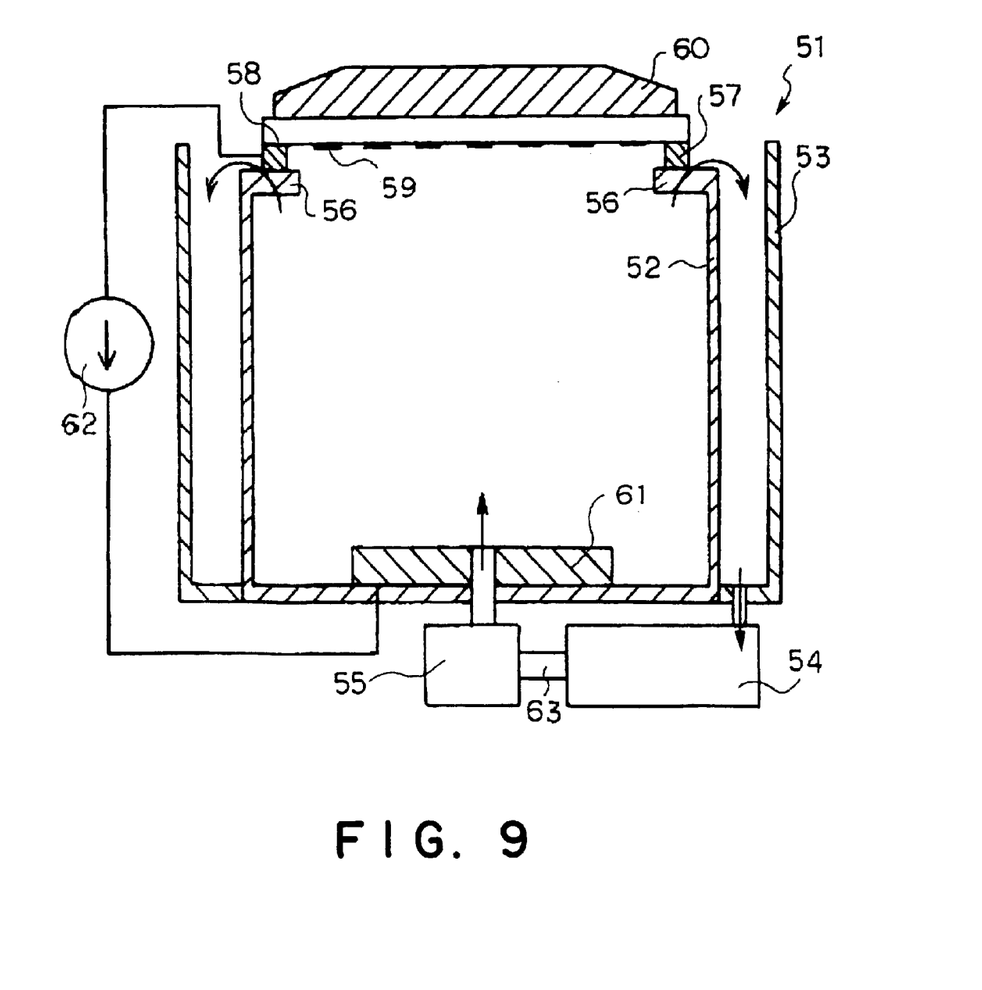
FIG. 9 is a schematically sectional view showing the conventional plating apparatus.

FIG. 9 shows a schematically sectional view of a plating apparatus used for the plating process.

As shown in FIG. 9, the plating apparatus 51 has a plating bath 52 filled up with a plating solution, an outer wall 53 arranged around the plating bath 52, a tank 54 for storing the plating solution and a pump 55 for supplying the plating solution in the tank 54 into the plating bath 52 via the center of a bottom of the plating bath 52.

The plating bath 52 is provided, on a top end thereof, with four inward projections 56 at intervals of 90 degrees on the inner peripheral face of the bath 52. On the inward projections 56, a copper ring 57 is mounted. On the copper ring 57, a wafer 58 as the object being processed is set while arranging its plating surface downward. On the wafer 58, an underlying electrode 59 is formed as the negative pole constituting the above plating surface and electrically connected to the copper ring 57. The wafer 58 mounted on the copper ring 57 is fixed by a fixing jig 60 utilizing pressing means. That is, the shown plating apparatus is constructed so that the plating solution in the plating bath 52 does not flow round the backside (upper face) of the wafer 58 even when the plating solution comes in contact with the wafer 58.

On the bottom of the plating bath 52, an anode plate 61 as the positive pole is arranged in parallel with the wafer 58. This anode plate 61 and the copper ring 57 are together connected to a power source 62 electrically.

In the plating apparatus 51, when the plating solution supplied into the plating bath 52 flows in the direction from the center part of the wafer 58 toward the periphery uniformly and fills up the plating bath 52, then the plating solution flows from the upper part of the bath 52 to the circumference. Then, the overflowing plating solution is stored into the tank 54 through a pipe 63. In this way, the plating apparatus 51 has a circulating structure to circulate the plating solution therein.

The feeding of electricity is initiated after several seconds have passed since the plating solution supplied into the plating bath 52 came into contact with the wafer 58, whereby a plating film is formed on the underlying electrode 59.

Meanwhile, the underlying electrode 59 is formed with fine irregularities and therefore, there is a possibility that the plating solution does not infiltrates into dents of the irregularities completely. Further, there is a case that air bubbles generated in the plating bath 52 stick to the underlying electrode 59, particularly, the above dents. In these cases, there would be generated an unevenness in a current distribution in the underlying electrode 59 thereby increasing a difference in thickness of a plating film formed on the underlying electrode 59 due to the current difference in the underlying electrode 59. Therefore, the plating apparatus has a problem of impossibility to form a uniform plating film on the underlying electrode 59.

Although the whole upper surface of copper ring 57 comes into contact with the wafer 58, it is difficult to accomplish a uniform contact resistance in the upper surface. Thus, due to the difference in contact resistance in both contact surfaces of the ring 57 and the wafer 58, there would be also generated the unevenness in the current distribution in the underlying electrode 59. Such the unevenness in the current distribution would cause a great difference in thickness of the plating film formed on the underlying electrode 59 due to the current difference in the underlying electrode 59. Also from this reason, there is a problem of impossibility to form the uniform plating film on the underlying electrode 59.

While, in case of using electrode pins in place of the copper ring 57, then it is possible to reduce the unevenness in the current distribution in the underlying electrode 59 in comparison with the previous case of using the copper ring 57. However, this measure is accompanied with a limitation of the amount of current capable of flowing through the electrode pins. Thus, the thickness of the plating film on the underlying electrode 59 is so limited that the plating apparatus has a problem of reduced applicability.

In order to solve the above-mentioned problems, an object of the present invention is to provide a plating apparatus, a plating system and a plating method using them, all of which can form a plating film having an uniform thickness on an object to be processed.

DISCLOSURE OF THE INVENTION

In order to solve the above-mentioned problems, the plating apparatus of the present invention is characterized by comprising a plating bath filled up with a plating solution, a connecting member arranged on a top part of the plating bath, for electrical connection with a first electrode formed on a semiconductor wafer, a second electrode disposed in the plating bath and an ultrasonic oscillating member arranged in the plating bath. According to the plating apparatus of the invention, the object to be processed is arranged on the connecting member in a manner that the first electrode is electrically connected with the connecting member and the plating solution is charged into the plating bath. When the plating bath is filled up with the plating solution, electricity is supplied into the plating apparatus and the ultrasonic oscillating member continuously applies ultrasonic oscillations into the plating bath. Although the supply of electricity causes the plating solution to be chemically reacted thereby to generate bubbles, for example, hydrogen bubbles in the plating solution, they are prevented from adhering to the first electrode owing to the ultrasonic oscillations of the solution itself. Additionally, the circulation of the plating solution in the plating bath is promoted by the ultrasonic oscillations, so that the plating solution is supplied to the whole surface of the first electrode. Thus, the current distribution on the first electrode becomes uniformly, so that a plating film having a uniform thickness is formed on the first electrode.

Further, the plating apparatus of the present invention is characterized in that the semiconductor wafer is arranged so that the first electrode to be processed directs downward and furthermore, the semiconductor wafer is fixed on the plating bath.

As the other feature in the plating apparatus of the present invention, the ultrasonic oscillating member changes the number of oscillations during plating. In this case, it is possible to vary the loop's position of a stationary wave in the plating bath. Accordingly, with the equalization in intensity of the oscillations, it is possible to prevent the occurrence of unevenness in the plating.

Further, the plating apparatus of the present invention is characterized by comprising a plating bath filled up with a plating solution, a first elastic member arranged on a top part of the plating bath, for electrical connection with a first electrode formed on a semiconductor wafer, a second elastic member arranged on the top part of the plating bath, for sealing up the first elastic member so as to prevent the plating solution in the plating bath from contact with the first elastic member and a second electrode disposed in the plating bath. According to the plating apparatus of the invention, owing the constitution of the first and second elastic members made from elastic materials, the contact resistance between the first elastic member and the first electrode is uniform under condition of arranging the object on the first and second elastic members so that the first electrode is electrically connected with the first elastic member. The uniform contact resistance allows the current distribution on the first electrode to be uniform thereby forming the plating film having a uniform thickness on the first electrode. Further, since the first electrode comes into contact with the upper face of the first elastic member and there is no possibility that the amount of current flowing through the first elastic member is limited remarkably, the plating film can be formed on the first electrode with a designated thickness. Repeatedly, since the object to be processed is arranged on the first and second elastic members so that the first electrode is electrically connected with the first elastic member, the plating solution won't come into contact with the first elastic member even when the plating bath is filled up with the plating solution. Therefore, the first elastic member is exempted from eduction of plating metals.

According to the invention, the plating apparatus is also characterized in that an ultrasonic oscillating member is arranged in the plating bath. Owing to the ultrasonic oscillations, it is possible to prevent the bubbles from adhering to the first electrode and promote the circulation of the plating solution in the plating bath. Therefore, the plating solution can be supplied on the whole surface of the first electrode thereby completing the uniform plating operation.

Again, in the plating apparatus of the present invention, the first elastic member and the second elastic member are shaped in the form of rings. Then, the forming of the first elastic member and the second elastic member and their arrangements on the plating apparatus can be completed with ease. As for materials for the elastic members, it is preferable that the first elastic member is made of conductive rubber while the second elastic member is made of chemically resistant rubber. Further, if the first elastic member is formed in spiral, then the stress on the first elastic member is dispersed thereby to improve its durability.

According to the present invention, the plating system is characterized by comprising a transporting device for carrying a semiconductor wafer being processed to transport it to a designated position, a plating apparatus for plating the semiconductor wafer transported by the transporting device, the plating apparatus having a plating bath filled up with a plating solution and an ultrasonic oscillating member arranged in the plating bath to apply ultrasonic oscillations on the plating solution during plating, a cleaning apparatus for washing and cleaning the semiconductor wafer having a plating film formed thereon by the plating apparatus and a drying apparatus for drying the semiconductor wafer cleaned by the cleaning apparatus. According to the plating system constructed above, the semiconductor wafer is carried by the transporting apparatus and transported to the plating apparatus where the plating film is formed on the semiconductor wafer. Then, the semiconductor wafer having the plating film formed thereon is again carried by the transporting device and transported to the cleaning apparatus for washing and cleaning the wafer. In the plating system, if the transporting apparatus is constructed so as to be capable of turning over the semiconductor wafer while carrying it, then it is possible to dry the wafer while directing the wafer's surface having the plating film formed thereon upward, whereby the structure of the drying apparatus can be simplified.

The plating method of the invention is characterized by comprising the steps of carrying a semiconductor wafer thereby to transport the semiconductor wafer to a designated position, plating the semiconductor wafer transported by the transporting apparatus by contact of the semiconductor wafer with a plating solution on which ultrasonic oscillations are being applied, thereby forming a plating film on a surface of the semiconductor wafer, cleaning the semiconductor wafer having the plating film formed at the plating step and drying the semiconductor wafer cleaned at the cleaning step. In the plating method, if interposing a step of turning the semiconductor wafer upside down while carrying the semiconductor between the cleaning step and the drying step, the drying step would be carried out while directing the wafer's surface having the plating film upward. Note that the plating method is applicable to a plating process, such as a copper plating.

BEST MODE OF EMBODIMENT OF THE INVENTION

One embodiment of the present invention will be described below, with reference to the drawings.

Figure 1:
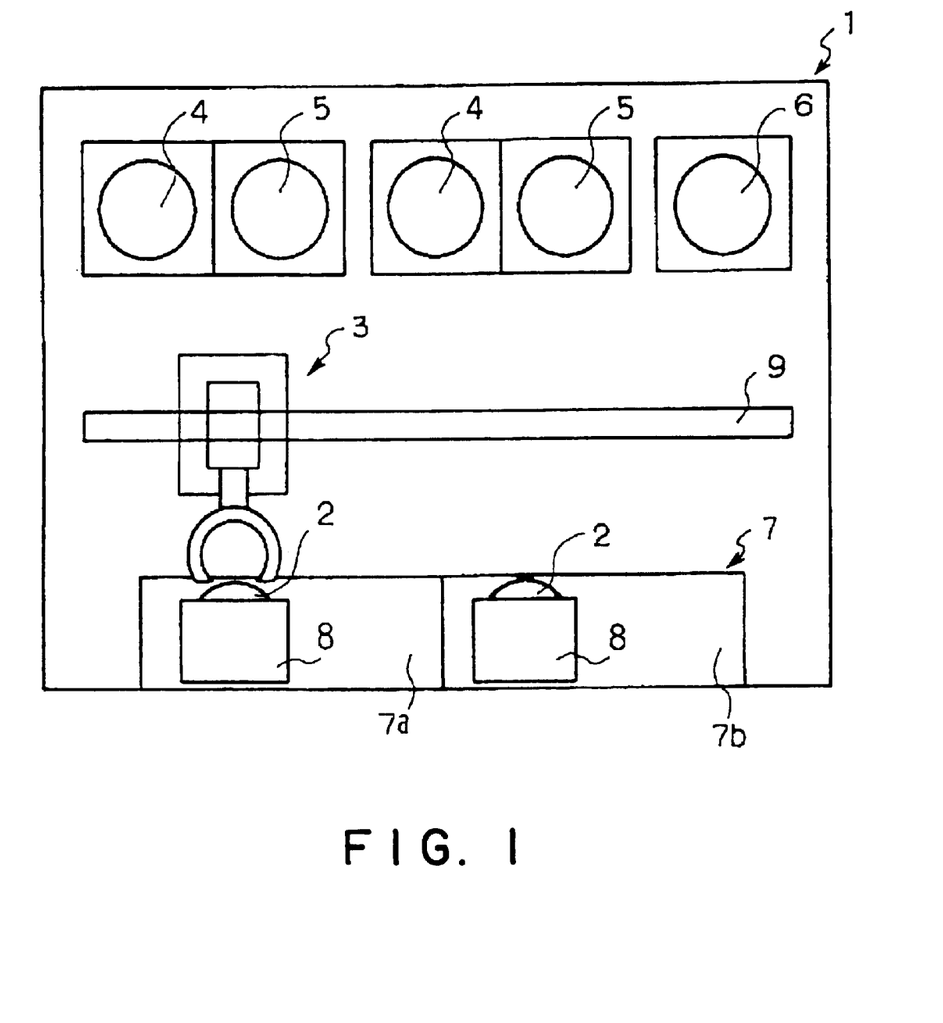
FIG. 1 is a schematic view showing one embodiment of the plating system in accordance with the present invention.

FIG. 1 is a schematic diagram showing the plating system in accordance with the embodiment of the invention. Note that the embodiment will be described by an example of a copper sulfate plating on general use.

As shown in FIG. 1, the plating system 1 comprises a transporting apparatus 3 for carrying a wafer 2 as the object to be processed and transporting it to a designated position, plating apparatus 4 for each forming a plating film on the surface of the wafer 2, cleaning apparatus 5 for each washing and cleaning the wafer 2 having the plating film formed thereon and a spin drier 6 as a drying unit for drying the wafer 2. Additionally, the plating system 1 is provided with a cassette station 7 which consists of a loading port 7a and. an unloading port 7b. Accommodated in the cassette station 7 are cassettes 8 each of which receives plural pieces of wafers, for example, twenty-five wafers 2. The plating system 1 of this embodiment has two sets of the plating apparatus 4 and the cleaning apparatus 5, while the plating apparatus 4, the cleaning apparatus 5 and the spin drier 6 are arranged in a row. A rail 9 is laid between the respective apparatus and the cassette station 7. The transporting apparatus 3 is arranged on the rail 9.

Figure 2:
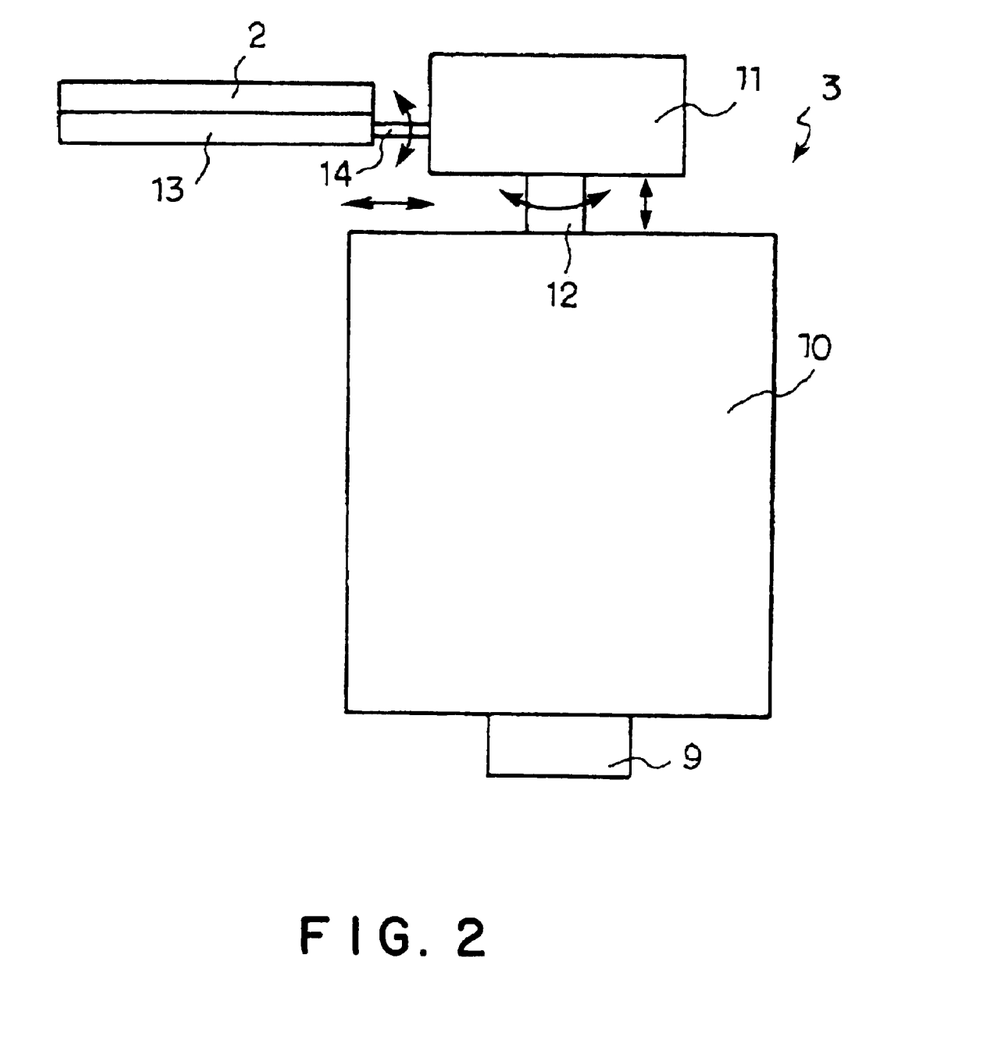
FIG. 2 is a schematically structural view showing a transporting apparatus in the plating system of FIG. 1.

FIG. 2 illustrates a schematic view of the transporting apparatus 3. As shown in FIG. 2, the transporting apparatus 3 includes a apparatus body 10 disposed on the rail 9, an arm support 11 arranged on the apparatus body 10, a support shaft 12 for supporting the arm support 11 rotatably, a transporting arm 13 for carrying the wafer 2 and an arm supporting shaft 14 for supporting the transporting arm 13 rotatably.

By a "not shown" driving mechanism, the apparatus body 10 is moved in a vertical direction to a page plane of FIG. 2 (left and right in FIG. 1). The arm support 11 is connected with the apparatus body 10 through the support shaft 12. Thus, when rotating the support shaft 12, the arm support 11 is rotated about the support shaft 12 as a center. The transporting arm 13 is connected with the arm support 11 through the arm-supporting shaft 14. When rotating the arm-supporting shaft 14, the transporting arm 13 is rotated about the arm-supporting shaft 14 as a center. That is, the transporting apparatus 3 is capable of turning over the wafer 2 while carrying it on the transporting arm 13. The support shaft 12 and the arm-supporting shaft 14 are adapted so as to project to their axial directions. Therefore, the projection of the support shaft 12 allows the arm support 11 to be elevated, while the projection of the arm supporting shaft 14 allows the transporting arm 13 to be projected. Accordingly, the transporting arm 12 is capable of moving up, down, left, right, back and forth, turning upside down and swiveling, so that the wafer 2 can be transported to a designated position owing to these movements. Note that the transporting arm 13 is provided with a not shown absorbing mechanism which allows the arm 13 to carry the wafer 2 in a so-called "vacuum chucking" manner to absorb the wafer 2 by the absorbing mechanism.

Figure 3:
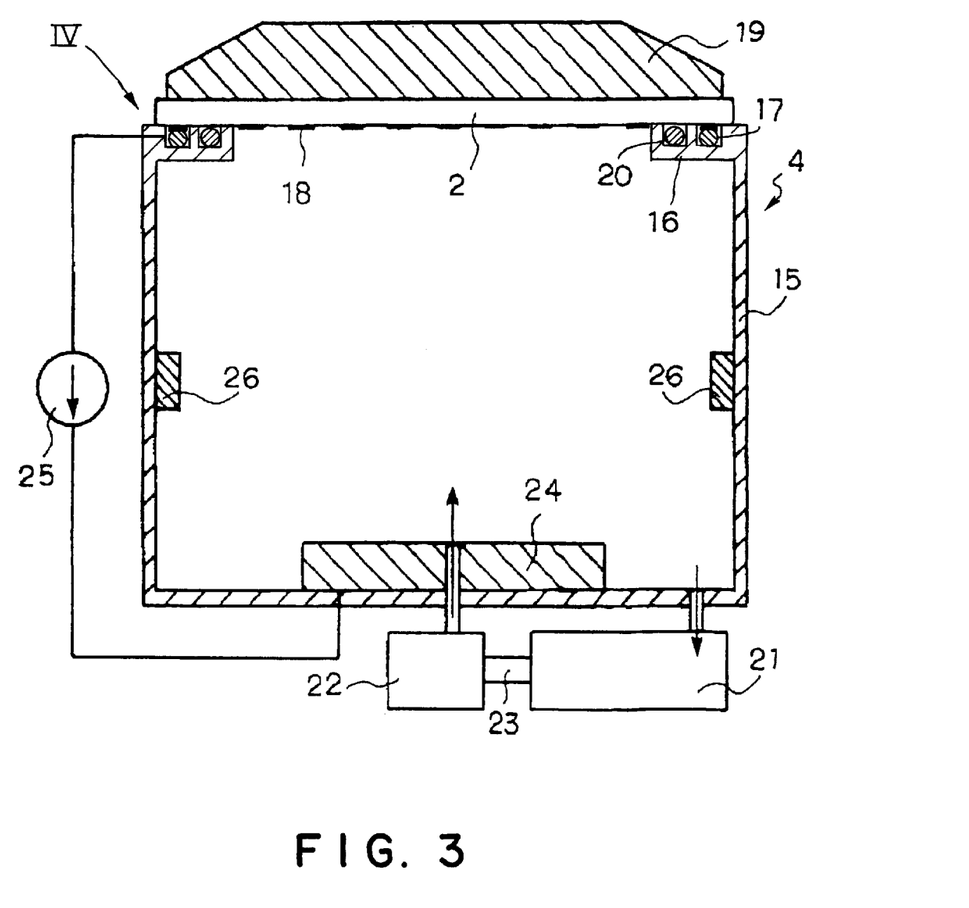
FIG. 3 is a sectional view showing one embodiment of the plating apparatus in accordance with the present invention.

FIG. 3 shows a schematic section of one plating apparatus 4. As shown in FIG. 3, the plating bath 15 filled up with a plating solution of copper sulfate (referred as "the plating solution" below) is shaped to be a substantial cylinder and also provided, over the whole circumference of its upper end, with a projection 16 which projects to the side of the inner periphery of the cylinder. Arranged in a top part of the projection 16 is a first O ring 17 as the first elastic member, which constitutes a connecting member. The first O ring 17 is made from an annular conductive material. In this embodiment, high conductive rubber having its inherent volume resistivity of $1 \times 10^2$ Ωcm is employed for the conductive material. With the arrangement that the wafer 2 has the underlying electrode 18 as the first electrode to direct the plating bath 15, the first O ring 17 is arranged so as to butt against the underlying electrode 18. Consequently, the first O ring 17 is electrically connected with the underlying electrode 18. Note that the underlying electrode 18 is shaped to have a fine configuration in advance, by e.g. CVD method. In the arrangement of the wafer 2 on the top of the plating bath 15, the wafer 2 is fixed by a fixing jig 19.

Arranged in the top part of the projection 16 and positioned on the inside of the first O ring 17 is a second O-ring 20 as the second elastic member, which also constitutes the connecting member. The second O ring 20 is made from an annular and high chemically resistant material. In this embodiment, acid resistant fluorine-containing rubber is employed for the high-chemically-resistant material. Under condition of arranging the wafer 2 on the second O ring 20, it is adapted so as to seal up the plating bath 15 in order to prevent the plating solution in the plating bath 15 from flowing outside of the second O ring 20. Thus, the plating solution in the plating bath 15 does not come in contact with the first O ring 17.

Below the plating bath 15, there are a tank 21 for reserving the plating solution and a pump 22 for feeding the plating solution in the tank 21 into the plating bath 15. In this embodiment, a magnet pump exhibiting a superior corrosion resistance is used for the pump 22 and the operation control using an inverter is carried out in order to allow the revolutions of the pump 22 to be varied. The tank 21 and the pump 22 are communicated with each other through a pipeline 23 penetrating the bottom face of the plating bath 15. Therefore, with the drive of the pump 22, the plating solution in the tank 21 is supplied into the plating bath 15 through the pipeline 23. As soon as the plating bath 15 is filled up with the plating solution, it is discharged from the plating bath 15 into the tank 21 through the pipeline 23. In this way, the plating apparatus 4 has a structure where the plating solution circulates around the plating bath 15, the tank 21 and the pump 22 in order, via the pipeline 23.

The plating bath 15 is provided, on its bottom face, with an anode plate 24 as the second electrode. The anode plate 24 is arranged so as to oppose the underlying electrode 18 under condition of arranging the wafer 2 on the first O ring 17 and the second O ring 20. The anode plate 24 is shaped so as not to disturb the flow of the plating solution supplied by the pump 22, namely, the configuration of a doughnut in this embodiment. The material of the anode plate 24 is dependent on the sorts of plating. Since the plating solution of copper sulfate is used in this embodiment, a copper plate containing phosphorus of 0.03 to 0.08 wt. % is used for the anode plate 24. The anode plate 24 and the first O ring 17 are electrically connected with a power source 25.

Further, ultrasonic oscillating elements 26 are arranged as the ultrasonic oscillating member on the inner wall of the plating bath 15. In this embodiment, the two ultrasonic oscillating elements 26 are arranged in the plating bath 15. These ultrasonic oscillating elements 26 serve to apply ultrasonic oscillations on the plating solution thereby expediting the circulation of the plating solution at the object's portion to be plated and also preventing the stagnation of bubbles.

Additionally, the ultrasonic oscillating elements 26 are adapted so as to change the number of oscillations during the plating process, periodically. Preferably, the plating is carried out while changing the number of oscillations within the range from 30 to 50 kHz for two seconds. Owing to the execution of plating like this, it is possible to vary the loop's position of the stationary wave formed in the plating bath periodically. Accordingly, it is possible to equalize the intensity of oscillations exerted on the plating surface, whereby the uniform plating can be completed while preventing the unevenness in the plating.

Figure 4:
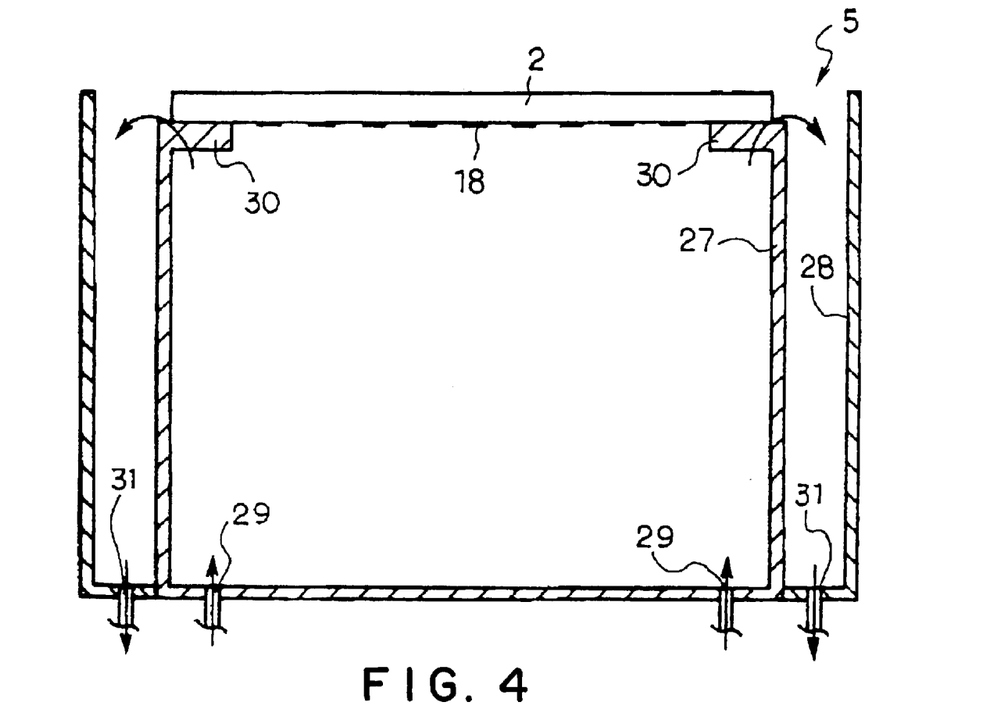
FIG. 4 is a sectional view showing a cleaning apparatus of the plating system shown in FIG. 1.

FIG. 4 shows a schematic section of the cleaning apparatus 5. As shown in FIG. 4, the cleaning apparatus 5 includes a cleaning bath 27 filled up with a cleaning solution, i.e., a demineralized water in this embodiment, an outer wall 28 arranged around the cleaning bath 27 and supply pipes 29 for supplying the demineralized water into the cleaning bath 27 via its lower part.

The cleaning bath 27 is provided, on a top end thereof, with projections 30 which project to the inner peripheral face of the bath 27. In this embodiment, the four projections 30 are formed at intervals of 90 degrees on the inner peripheral face of the bath 27. On the projections 30, the wafer 2 is mounted so as to direct its plated surface (the side of the underlying electrode 18) downward.

In the cleaning apparatus 5, when the cleaning bath 27 is filled up with the demineralized water, then it is forced to the direction of the margin of the cleaning bath 27 through its upper part. Then, the demineralized water forced to the direction of the margin is discharged to the outside through drainpipes 31 between the cleaning bath 27 and the outer wall 28.

Figure 5:
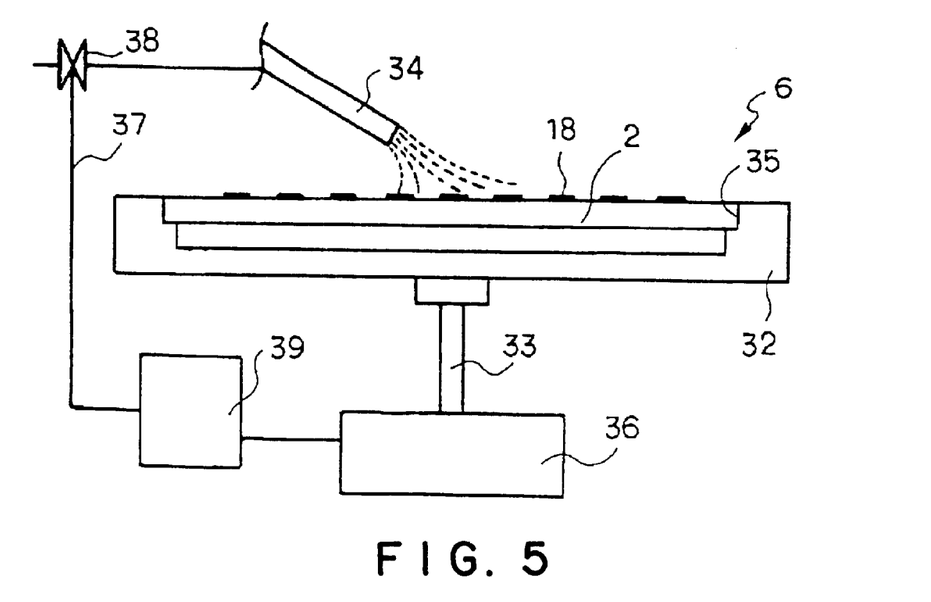
FIG. 5 is a schematic view showing a spin drier of the plating system shown in FIG. 1.

FIG. 5 is a schematic diagram of the spin drier 6. As shown in FIG. 5, the spin drier 6 includes a wafer support 32 for supporting the wafer 2, a rotating shaft 33 for rotating the wafer support 32 and an air nozzle 34 which is capabe of ejecting gas against the wafer 2 while it is being carried by the wafer support 32.

The wafer support 32 is provided with a recess 35 which corresponds to the profile of the wafer 2. In the recess 35, the wafer 2 is accommodated while directing its surface having the underlying electrode 18 upward. A motor 36 is connected to the rotating shaft 33. The drive of the motor 36 allows the rotating shaft 33 to be rotated, so that the wafer support 32 is rotated about the rotating shaft 33 as a center. The air nozzle 34 is arranged so as to blow the gas against the vicinity of the center of the wafer 2.

The air nozzle 34 is connected with a gas pipeline 37. An electromagnetic valve 38 performs the gas supply for the nozzle 34. Further, the electromagnetic valve 38 and the motor 36 are connected with a controller 39 which controls the rotation of the wafer 2 and the gas blow against the wafer 2. Thus, in the spin drier 6, it is executed to dry the wafer 2 while directing its surface having the plating film upward.

Figure 6:
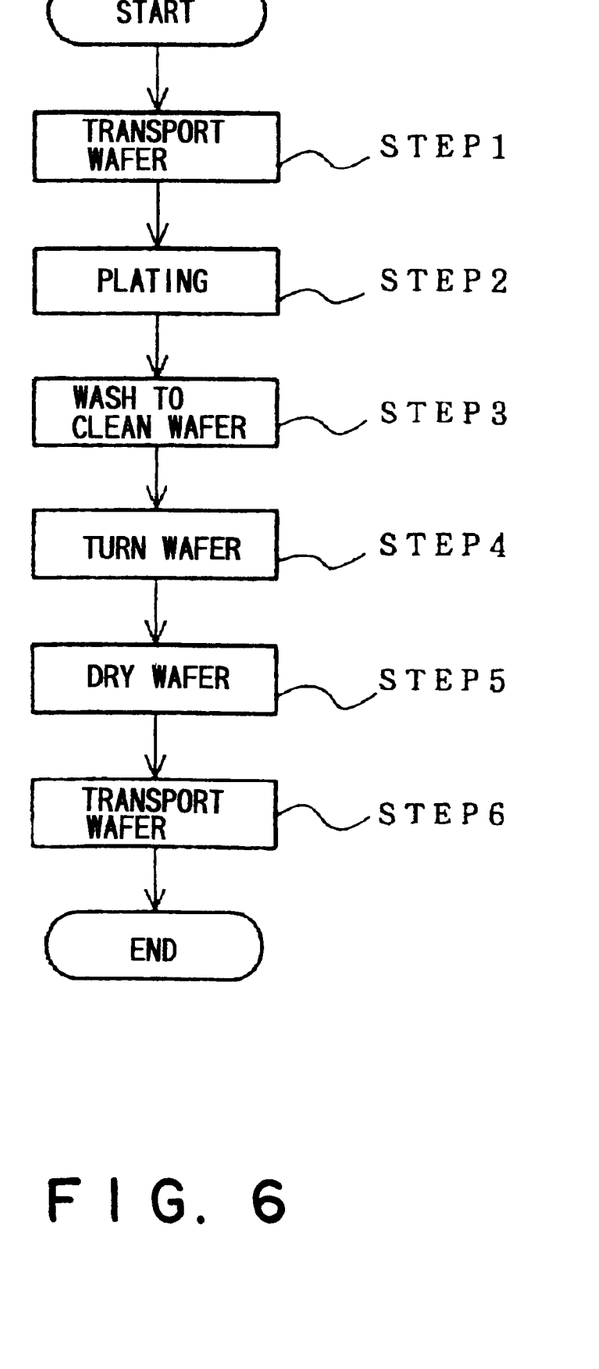
FIG. 6 is a flow chart for explanation of the plating method in accordance with the present invention.

Next, we describe the plating method using the above-constructed plating system 1. FIG. 6 shows a flow chart to carry out the plating method.

First of all, move the transporting apparatus 3 to the front of the cassette 8 accommodated in the loading port 7a of the cassette station and absorb the wafer 2 having the underlying electrode 18, which is accommodated in the cassette 8, by the absorbing mechanism of the transporting arm 13, thereby to carry the wafer 2. Next, move the transporting apparatus 3 carrying the wafer 2 to the front of the plating apparatus 4 and continuously arrange the wafer 2 on the first O ring 17 and the second O ring 20 on the upside of the plating bath 15 in a manner that the underlying electrode 18 of the wafer 2 looks toward the plating bath 15 (STEP 1).

Next, upon fixing the wafer 2 by the fixing jig 19, operate the pump 22 to supply the plating solution in the tank 21 into the plating bath 15. Employed as the plating solution in this embodiment is a plating solution of copper sulfate which is obtained by mixing copper sulfate of 200 g/1 liter and sulfuric acid of 50 g/1 liter with water and whose temperature is maintained at 30° C. After several seconds have passed since the plating bath 15 was filled up with the plating solution to cause the contact with the wafer 2, it is started to feed the electricity into the plating apparatus. Simultaneously, it is executed to apply the ultrasonic oscillations on the interior of the plating bath 15 by the ultrasonic oscillating elements 26 continuously. In this embodiment, the underlying electrode 18 has 10 A/cm$^2$ in current density, the anode plate 24 has a current density of 5 A/cm$^2$, and the voltage is equal to 4 V Further note that the frequency of each ultrasonic oscillating element 26 is equal to 50 kHz. With the supply of electricity under these conditions, the chemical reaction is caused in the plating solution, so that copper ions in the solution are turned to copper being absorbed on the underlying electrode 18, thereby forming the plating film of copper (STEP 2).

Although the hydrogen bubbles are produced in the plating solution by the chemical reaction of the plating solution due to the supply of electricity, the bubbles are prevented from adhering to the underlying electrode 18 by the ultrasonic oscillations from the ultrasonic oscillating elements 26. Additionally, the circulation of the plating solution in the plating bath 15 is expedited to facilitate the supply of the plating solution on the whole surface of the underlying electrode 18. In addition, the first O ring 17 and the second O ring 20 are together made of rubber materials. Thus, the contact resistance between the first O ring 17 and the first electrode 18 is equalized under condition that the wafer 2 is fixed on the rings 17, 18 by the fixing jig 19. Therefore, when the power is supplied from the power source 25, the distribution of current on the underlying electrode 18 becomes uniform, whereby the plating film of a uniform thickness can be formed on the electrode 18.

Further, since the underlying electrode 18 comes into contact with the upper face of the first O ring 17, the amount of flowing current is not subjected to a great limitation, different from the conventional electrode pins. Thus, it is possible to form the plating film on the first electrode 18 with a designated thickness.

Further, when the wafer 2 is fixed by the fixing jig 19, the plating bath is sealed up with the wafer 2 and the second O ring 20. Consequently, the plating solution does not come into contact with the first O ring 17 outside the second O ring 20 even while the plating bath 15 is filled up with the plating solution. Thus, the first O ring 17 can be exempted from deduction of copper.

After forming the plating film on the underlying electrode 18 of the wafer 2, move the transporting apparatus 3 to the front of the cleaning apparatus 5 while the wafer 2 is being carried by the absorbing mechanism of the transporting arm 13. Subsequently, arrange the wafer 2 on the projections 30 of the cleaning bath 27 so as to direct the underlying electrode 18 of the wafer 2 toward the cleaning bath 27. In this state, the demineralized water is supplied into the cleaning bath 27 to wash the plating solution adhering to the wafer 2 on the projections 30 (STEP 3).

After cleaning the wafer 2, the arm-supporting shaft 14 is rotated to turn the wafer 2 upside down while carrying the wafer 2 by the absorbing mechanism of the transporting arm 13. Consequently, the wafer's surface having the underlying electrode 18 looks upward (STEP 4).

On condition of the wafer's surface having the underlying electrode 18 looking upward, move the transporting apparatus 3 to the front of the spin drier 6 and accommodate the wafer 2 in the recess 35 on the wafer support 32. Next, by the controller 39, the motor 36 is driven to rotate the wafer 2 and the electromagnetic valve 38 is opened, so that the gas fed through the gas pipeline 37 is blown against the vicinity of the center of the wafer 2 through the air nozzle 34. With the rotation of the wafer 2, the demineralized water sticking to the wafer 2 is dispersed around due to the centrifugal force. Further, in the neighborhood of the center of the wafer 2 where the water is difficult to be scattered by only the centrifugal force, the gas is sprayed from the air nozzle 34 sprays the wafer 2 with the gas. In this way, the demineralized water sticking to the vicinity of the center of the wafer 2 can be scattered about the periphery or outside of the wafer 2. Thus, the demineralized water sticking to the wafer 2 is removed for dry (STEP 5).

Finally, while the wafer 2 is being carried by the absorbing mechanism of the transporting arm 13, the transporting apparatus 3 is moved to the front of the cassette 8 accommodated in the unloading port 7b of the cassette station 7. Then, the wafer 2 is accommodated in the cassette 8 (STEP 6).

Figure 7:
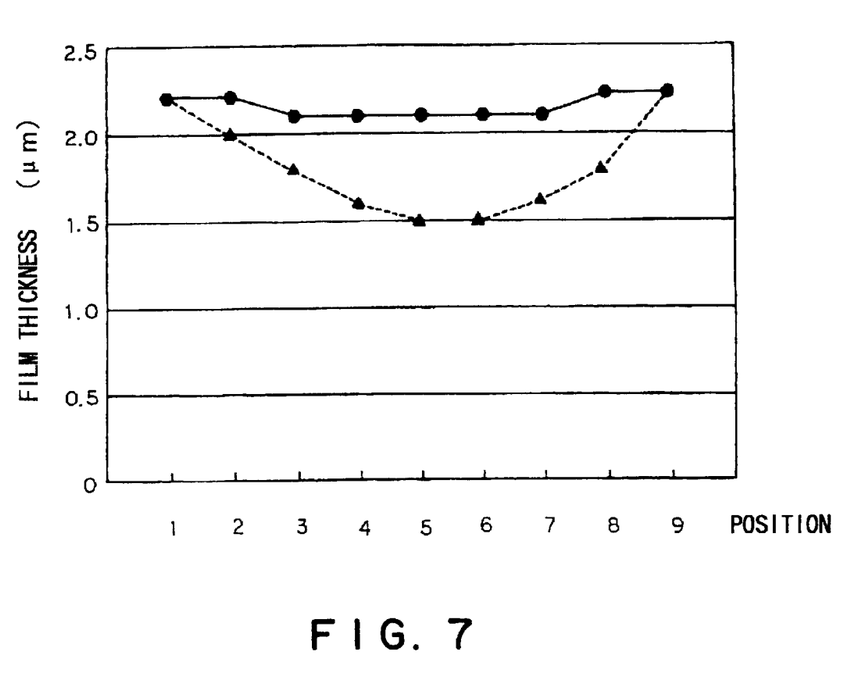
FIG. 7 is a graph showing a film thickness of a so-formed plating film.

In order to confirm an effect brought by the embodiment, we have measured a thickness of the plating film formed on the underlying electrode 18 of the wafer 2, at nine points on a straight line running on the center of the wafer 2 at regular intervals. The inspection results are shown in FIG. 7. As a reference, we have also measured the thickness of the plating film formed by the conventional plating apparatus 51 as well. This result is also shown with a broken line of FIG. 7. From FIG. 7, it is found that the plating film formed in the embodiment has a film thickness of about 2.1 $\mu$m substantially uniformly, representing the remarkable improvement in comparison with the film thickness of 1.5 to 2.2 $\mu$m of the plating film in the conventional apparatus. In this way, it has been confirmed that the present invention is capable of forming the plating film of a uniform thickness on the underlying electrode 18 of the wafer 2.

According to the embodiment, owing to the ultrasonic oscillations by the ultrasonic oscillating elements 26, the hydrogen bubbles resulting from the chemical reaction caused in the plating solution by the flow of electricity are prevented from adhering to the first electrode. Further, by the ultrasonic oscillations, the circulation of the plating solution in the plating bath is expedited to facilitate the supply of the plating solution on the whole surface of the underlying electrode 18. Accordingly, the distribution of current on the underlying electrode 18 becomes uniformly, so that the plating film of a uniform thickness can be formed on the electrode 18.

According to the embodiment, since the first O ring 17 and the second O ring 20 are together made of rubber materials, the contact resistance between the first O ring 17 and the first electrode 18 is equalized uniformly. Therefore, the distribution of current on the underlying electrode 18 becomes uniform, whereby the plating film of a uniform thickness can be formed on the electrode 18.

Further, since the underlying electrode 18 comes into contact with the upper face of the first O ring 17, the amount of flowing current is not subjected to a great limitation, different from the conventional electrode pins. Thus, it is possible to form the plating film on the first electrode 18 with a designated thickness.

Further, the second O ring 20 is shaped to have a configuration to seal up with the plating bath 15 so that the plating solution in the plating bath 15 does not flow outside the second O ring 20. Accordingly, the plating solution does not come into contact with the first O ring 17. Thus, the first O ring 17 can be exempted from deduction of copper.

According to the embodiment, the plating apparatus 4 is so constructed as to seal up the plating bath 15 while arranging the wafer 2 on the first O ring 17 and the second O ring 20. Therefore, there is no possibility that the plating solution in the plating bath 15 adheres to the upper face of the wafer 2.

According to the embodiment, the wafer 2 is accommodated in the recess on the wafer support 32 while directing the wafer's surface having the plating film coated thereon upward. Therefore, such the arrangement facilitates the supporting of the wafer 2, so that the structure of the spin drier 6 can be simplified.

According to the embodiment, the first O ring 17 and the second O ring 20 are in the form of rings. Thus, it is possible to facilitate the formation of the first O ring 17 and the second O ring 20 and the arrangement of the rings 17, 20 on the plating apparatus 4. Further, owing to the use of high conductive rubber for the first O ring 17 and the use of fluorine-containing rubber for the second O ring 20, their durability can be improved.

Note that the invention is not limited to the above-mentioned embodiment and, for example, the invention may be applied for the following cases.

Although the first O ring 17 and the second O ring 20 in the above-mentioned embodiment constitute the connecting member of the present invention, it is not limited to these rings only. For example, a conductive member may be fitted in the projection 16 of the plating bath 15. Alternatively, the first O ring 17 and the second O ring 20 may be formed into one body. Commonly in both cases, such the conductive member would be arranged in the plating apparatus 4 with ease.

Figure 8:
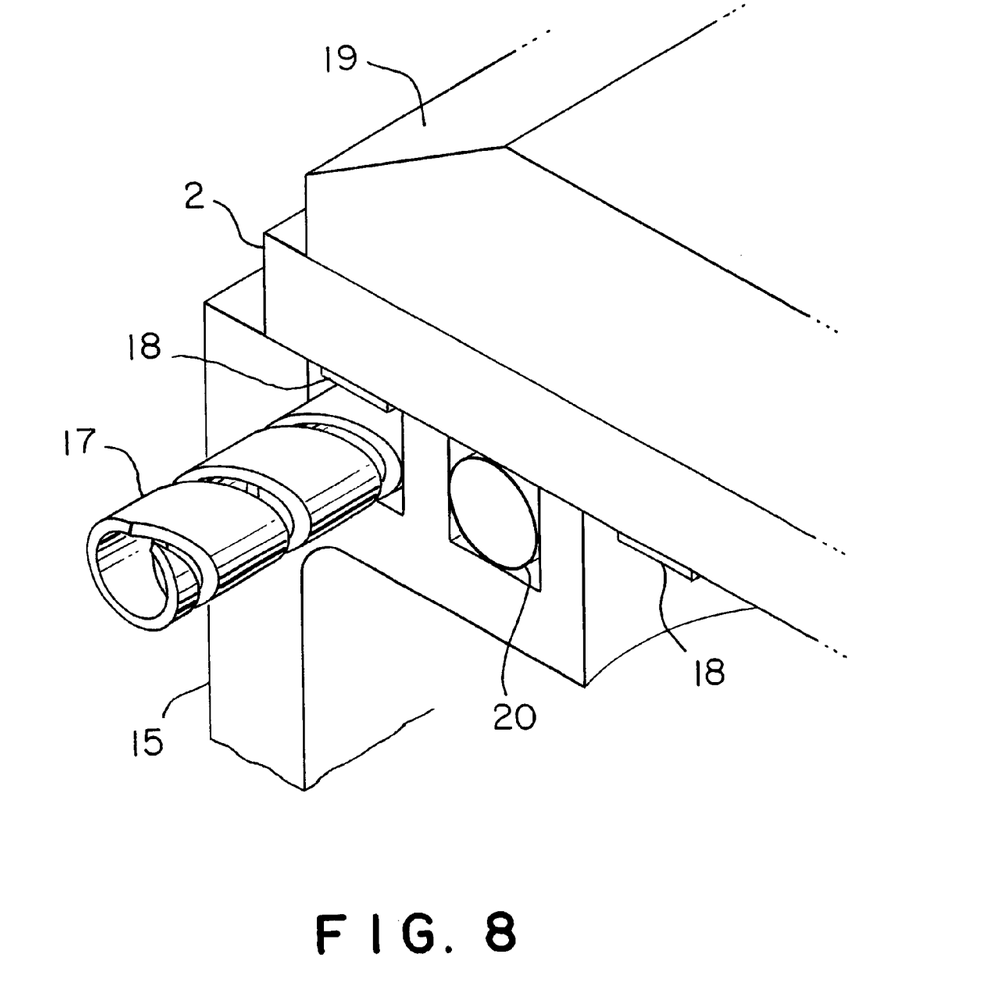
FIG. 8 is an enlarged perspective view showing another embodiment of a portion shown with numeral mark IV.

The first elastic member has only to be electrically connected with the underlying electrode 18 and therefore, the configuration of the member is not necessarily the annular form only but an arc, for example. Alternatively, as shown in FIG. 8, the first O ring 17 may be in the form of a spiral ring allowing its surface to press the underlying electrode 18 for its electrical connection. In such a case, the stress exerted on the first O ring 17 would be dispersed thereby to improve the durability of the ring 17.

Similarly, the second elastic member has only to prevent the plating solution in the plating bath 15 from contact with the first elastic member and therefore, the configuration of the second member is not necessarily the annular form.

Upon arranging a concentration sensor in the plating bath 15 to measure the concentration of plating solution, the plating apparatus may be provided with a concentration control member which controls the concentration of plating solution on the basis of the so-measured concentration. Then, it is possible to maintain the constant concentration of plating solution in the plating bath 15 and therefore, the plating film of a predetermined thickness could be formed on the underlying electrode 18 even if operating the plating apparatus 4 continuously.

Without providing the cleaning apparatus 5 in the plating system 1, the cleaning process may be performed in the plating apparatus 4. Then, upon formation of a plating film on the underlying electrode 18, the plating bath 15 is supplied with e.g. nitrogen gas thereby to remove the plating solution and thereafter, the demineralized water is newly supplied into the bath 15.

The plating apparatus 4 is not limited to the structure where the plating bath 15 can be sealed up while arranging the wafer 2 on the first O ring 17 and the second O ring 20. In the modification, the plating apparatus 4 may be equipped with the outer wall around the plating bath 15 and a circulation structure similar to the conventional plating apparatus. In the structure, the plating solution forced around the wafer 2 is stored in the tank 21 via a space between the plating bath 15 and the outer wall. Also in this case, it would be possible to obtain effects similar to those in the above-mentioned embodiment.

Although the embodiment of the invention has been described with reference to the "copper sulfate" plating, the present invention is not limited to only the above plating but another plating, for example, organic acid-solder plating. In this modification, a high-purity soldering plate corresponding to the ratio of tin component to lead component in the plating solution will be employed as the anode plate 24. Additionally, the above copper plating may be replaced with a silver plating.

Again, although the above-mentioned embodiment of the invention has been described with reference to the case of forming a plating film of about 2.1 μm in thickness on the underlying electrode 18, a variety of conditions (e.g. composition of a plating solution, normal plating condition, temperature of a plating solution, etc.) differ from one plating film being formed to another. For example, if adding a very small quantity of chlorine into the plating solution, then it is possible to improve both physical properties and appearance of the resultant plating film. Further, by adding a very small quantity of sulfur organic compound as an additive into the plating solution, it is possible to improve the gloss of plating film.

As mentioned above, according to the present invention, it is possible to form a plating film of a uniform thickness on the object to be processed.

What is claimed is:

1. A plating apparatus comprising:
    a plating bath configured to be filled up with a plating solution;
    a connecting member arranged on a top part of the plating bath for electrical connection with a first electrode formed on a semiconductor wafer;
    a second electrode disposed in the plating bath; and
    an ultrasonic oscillating member arranged in the plating bath.

2. A plating apparatus as claimed in claim 1, wherein the semiconductor wafer is arranged so that the first electrode to be processed directs downward.

3. A plating apparatus as claimed in claim 1, wherein the semiconductor wafer is fixed on the plating bath.

4. A plating apparatus as claimed in claim 1, wherein the ultrasonic oscillating member changes the number of oscillations during plating.

5. A plating apparatus as claimed in claim 1, wherein the connecting member is a first elastic member in the form of a ring.

6. A plating apparatus as claimed in claim 1, further comprising a second elastic member for sealing up the connecting member so as to prevent the plating solution in the plating bath from contact with the first elastic member.

7. A plating apparatus comprising:
    a plating bath configured to be filled up with a plating solution;
    a first elastic member arranged on a top part of the plating bath for electrical connection with a first electrode formed on a semiconductor wafer;
    a second elastic member arranged on the top part of the plating bath for sealing up the first elastic member so as to prevent the plating solution in the plating bath from contact with the first elastic member; and
    a second electrode disposed in the plating bath.

8. A plating apparatus as claimed in claim 7, further comprising an ultrasonic oscillating member arranged in the plating bath.

9. A plating apparatus as claimed in claim 7, wherein
    the first elastic member and the second elastic member are in the form of rings; and
    the first elastic member is made of conductive rubber, while the second elastic member is made of chemically resistant rubber.

10. A plating apparatus as claimed in claim 7, wherein
    the first elastic member and the second elastic member are in the form of rings;
    the second elastic member is made of chemically resistant rubber; and
    the first elastic member is formed in spiral in its circumferential direction and also connected to the first electrode since a spiral-shaped surface of the first elastic member comes into contact with the first electrode.

* * * * *